(12) United States Patent
Ewe et al.

(10) Patent No.: US 8,866,302 B2
(45) Date of Patent: Oct. 21, 2014

(54) DEVICE INCLUDING TWO SEMICONDUCTOR CHIPS AND MANUFACTURING THEREOF

(75) Inventors: Henrik Ewe, Burglengenfeld (DE); Joachim Mahler, Regensburg (DE); Anton Prueckl, Schierling (DE); Stefan Landau, Wehrheim (DE)

(73) Assignee: Infineon Technologies AG, Neubiberg (DE)

( * ) Notice: Subject to any disclaimer, the term of this patent is extended or adjusted under 35 U.S.C. 154(b) by 489 days.

(21) Appl. No.: 13/013,022

(22) Filed: Jan. 25, 2011

(65) Prior Publication Data

US 2012/0187565 A1 Jul. 26, 2012

(51) Int. Cl.
*H01L 29/72* (2006.01)

(52) U.S. Cl.
USPC ............ 257/774; 257/E21.499; 257/E23.011; 438/107

(58) Field of Classification Search
USPC ............ 257/774, E21.499, E23.011; 438/107
See application file for complete search history.

(56) References Cited

U.S. PATENT DOCUMENTS

| | | | |
|---|---|---|---|
| 5,856,913 A | 1/1999 | Heilbronner | |
| 7,732,929 B2 | 6/2010 | Otremba et al. | |
| 7,847,316 B2 | 12/2010 | Torii | |
| 8,686,569 B2 | 4/2014 | Daeche et al. | |
| 2002/0149103 A1* | 10/2002 | Yang et al. | 257/723 |
| 2006/0169976 A1* | 8/2006 | Kameda et al. | 257/44 |
| 2008/0157787 A1* | 7/2008 | Misra et al. | 324/686 |
| 2009/0239336 A1 | 9/2009 | Lee et al. | |
| 2010/0109139 A1 | 5/2010 | Lee | |

FOREIGN PATENT DOCUMENTS

| | | |
|---|---|---|
| DE | 19617055 C1 | 6/1997 |
| DE | 199 54 941 A1 | 6/2001 |
| DE | 102005055761 A1 | 5/2007 |
| DE | 10 2007 017 831 A1 | 10/2008 |
| DE | 102011056403 A1 | 6/2012 |
| EP | 1 230 680 B1 | 8/2004 |
| KR | 20090105570 A | 10/2009 |

* cited by examiner

*Primary Examiner* — Edward Wojciechowicz
(74) *Attorney, Agent, or Firm* — Slater & Matsil, L.L.P.

(57) ABSTRACT

A device includes a first semiconductor chip with a first contact pad on a first face and a second semiconductor chip with a first contact pad on a first face. The second semiconductor chip is placed over the first semiconductor chip, wherein the first face of the first semiconductor chip faces the first face of the second semiconductor chip. Exactly one layer of an electrically conductive material is arranged between the first semiconductor chip and the second semiconductor chip. The exactly one layer of an electrically conductive material electrically couples the first contact pad of the first semiconductor chip to the first contact pad of the second semiconductor chip.

22 Claims, 17 Drawing Sheets

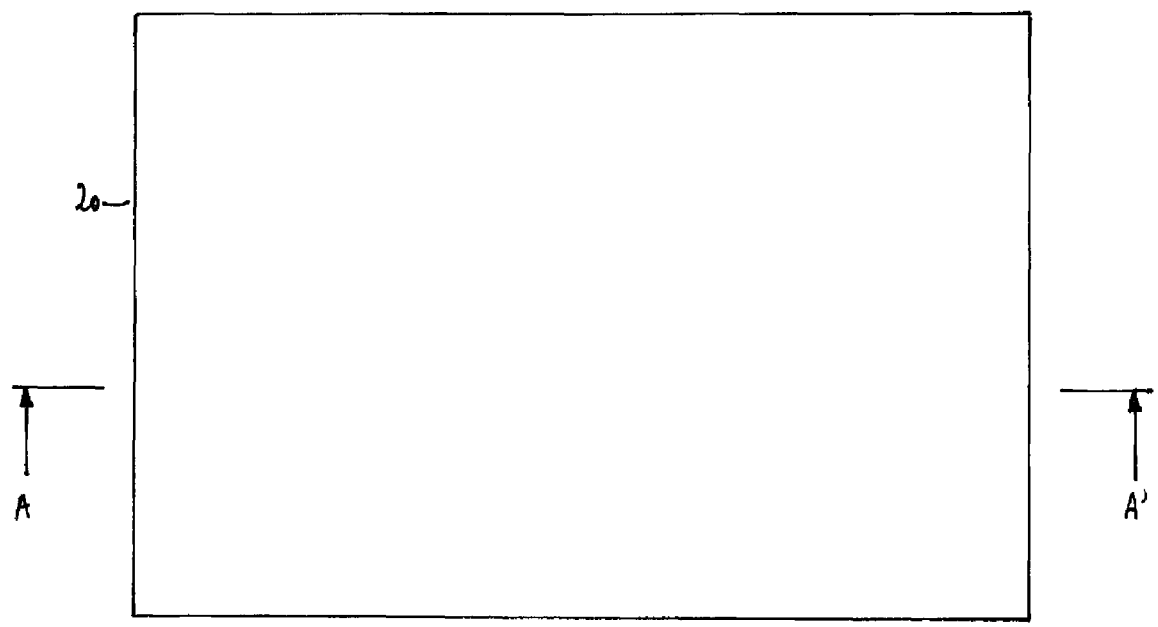
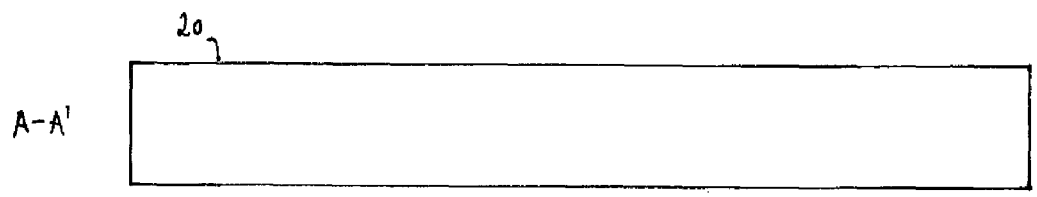
Fig. 2A

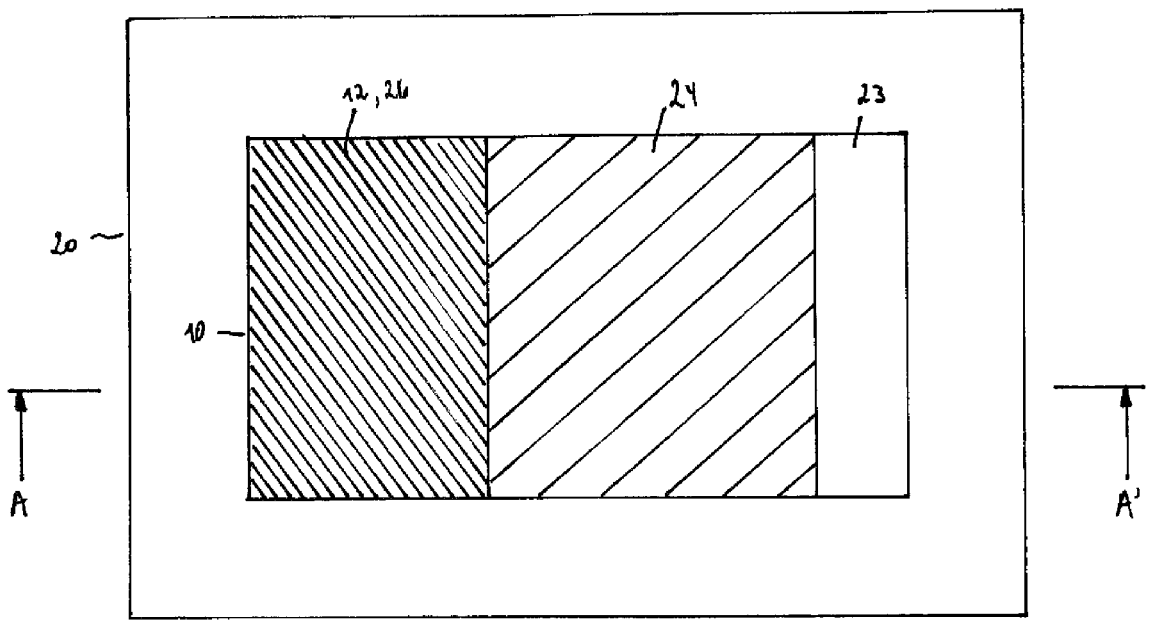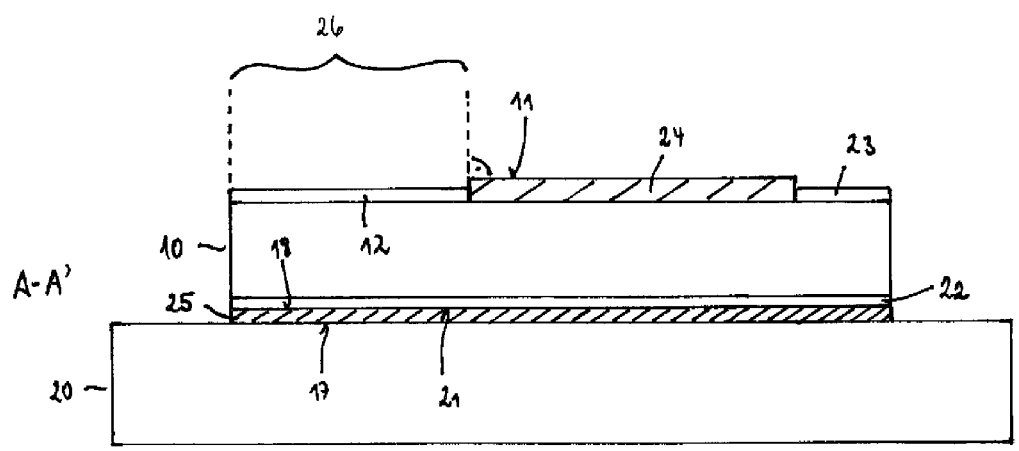
Fig. 2B

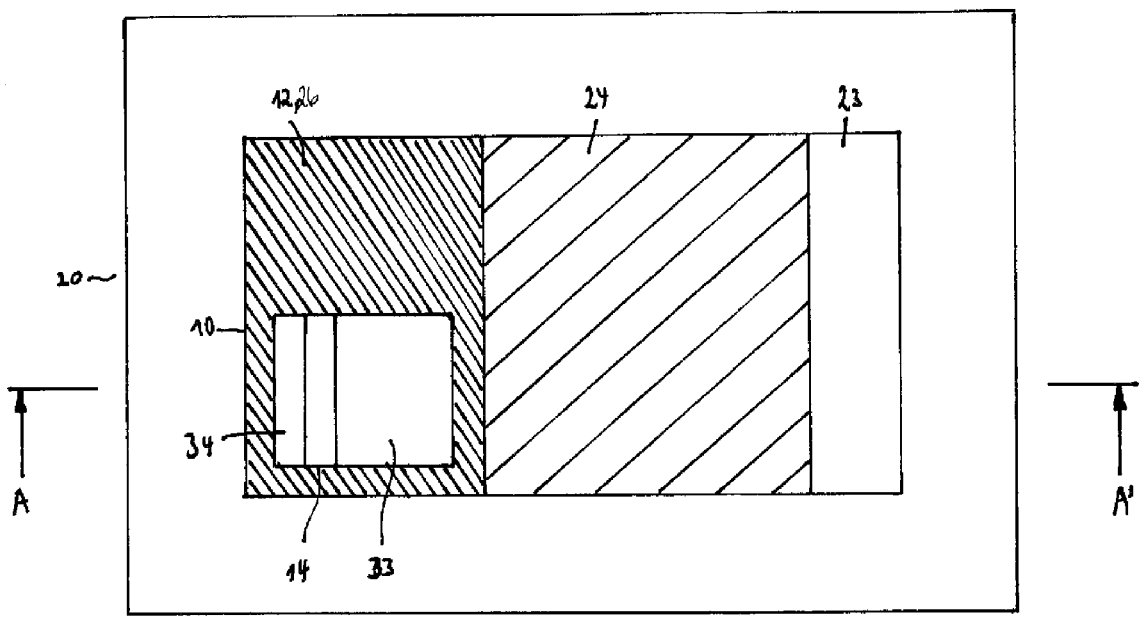
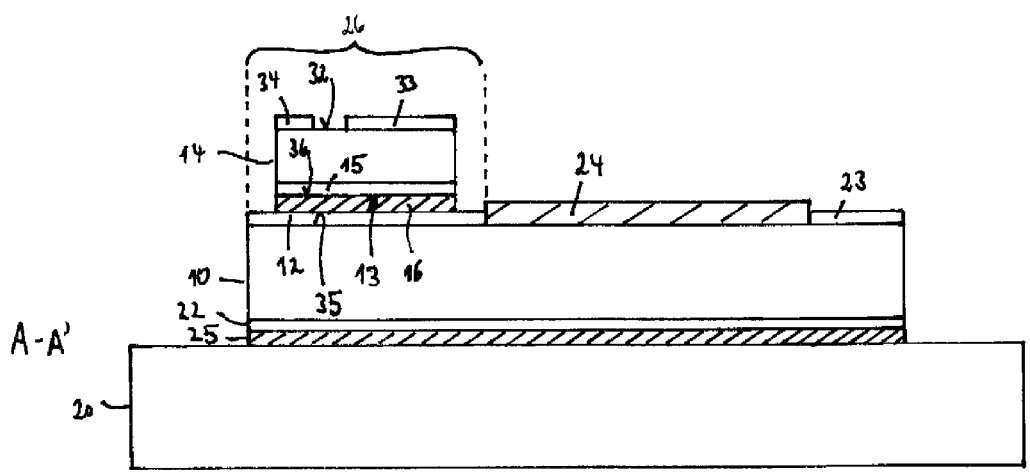
Fig. 2C

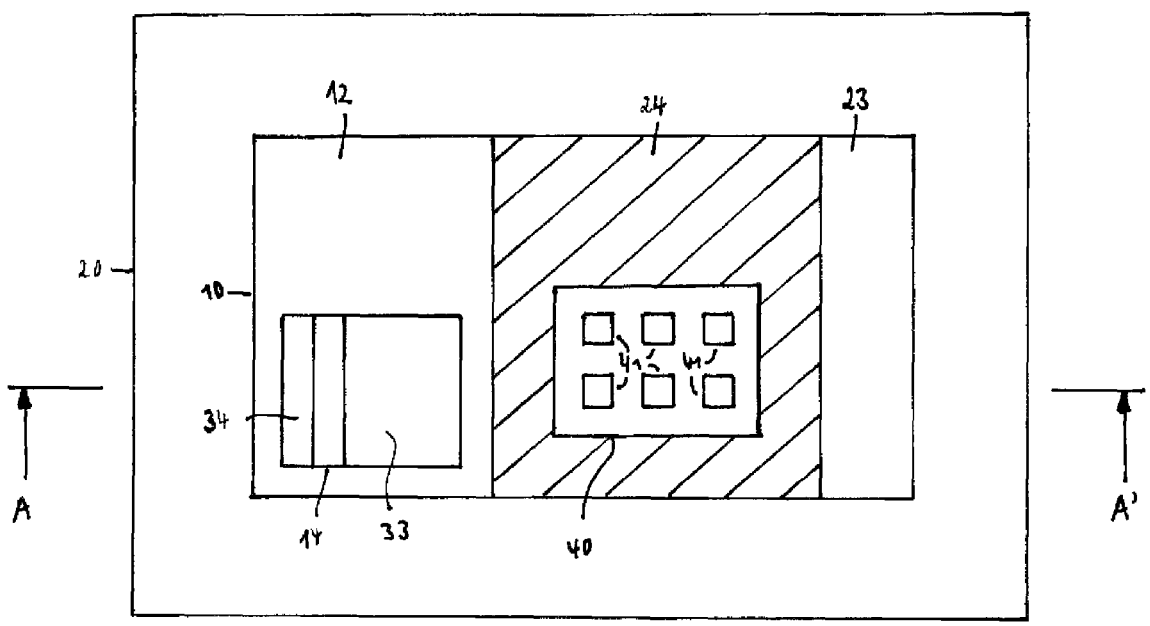
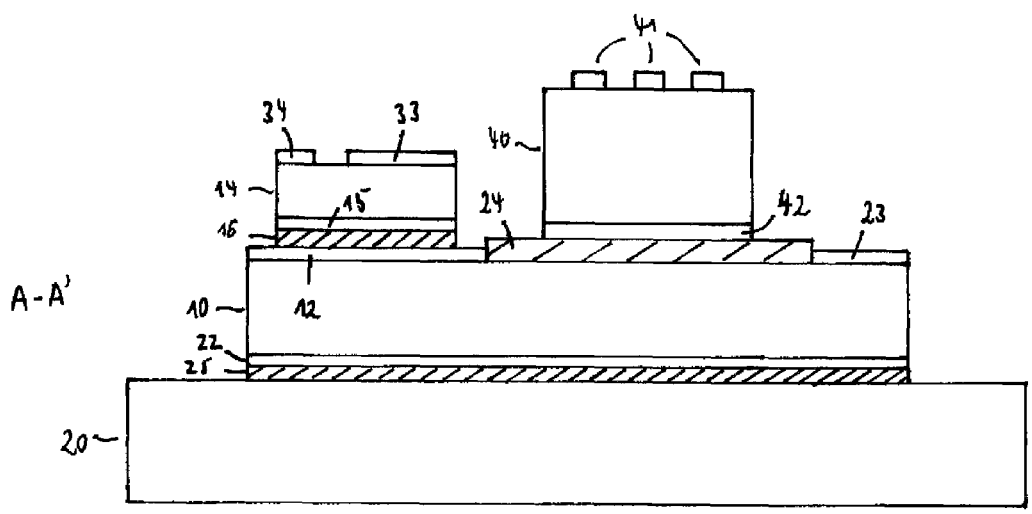
Fig. 2D

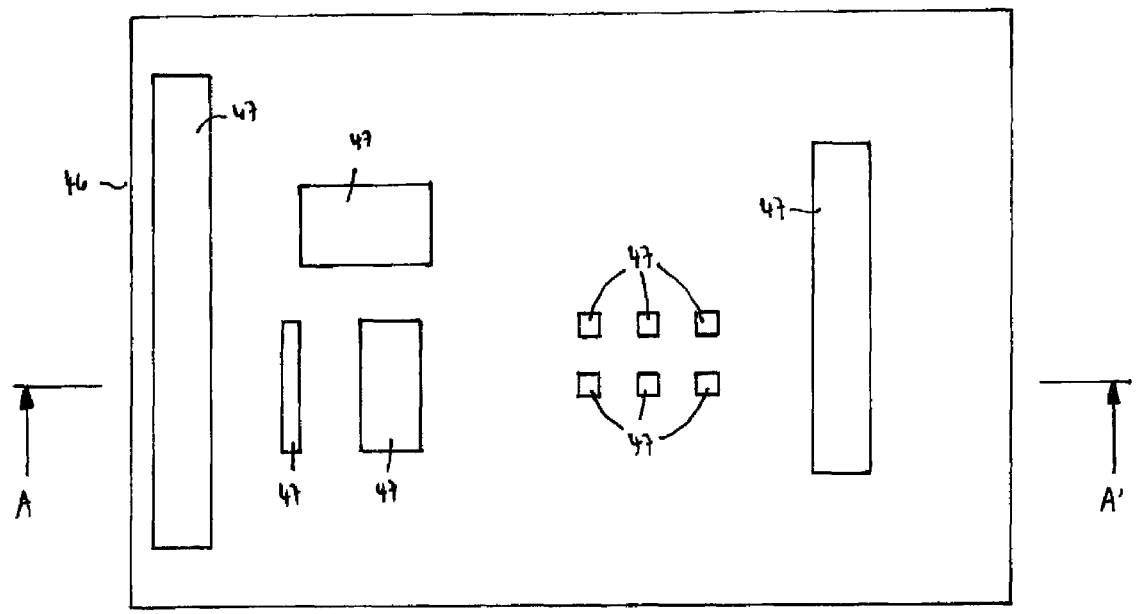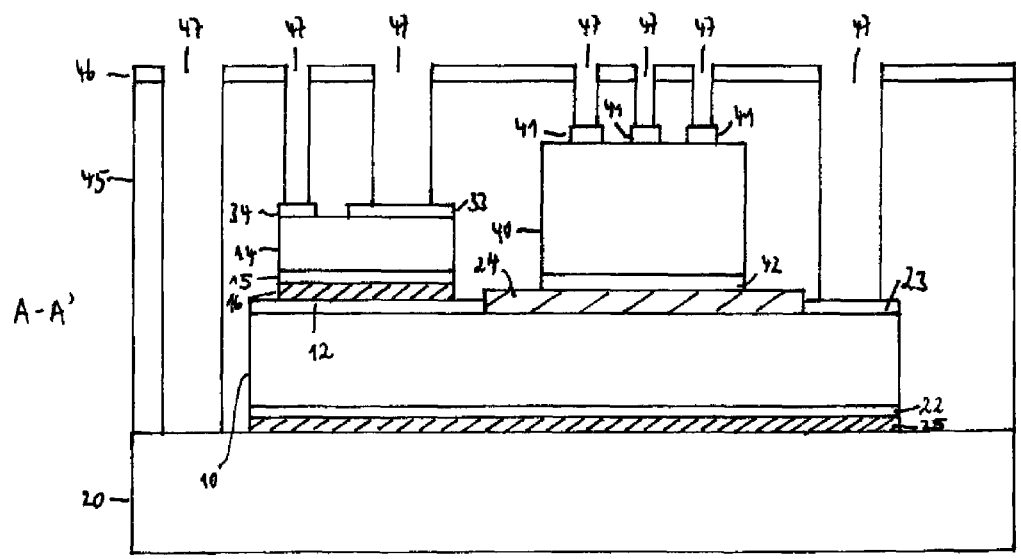
Fig. 26

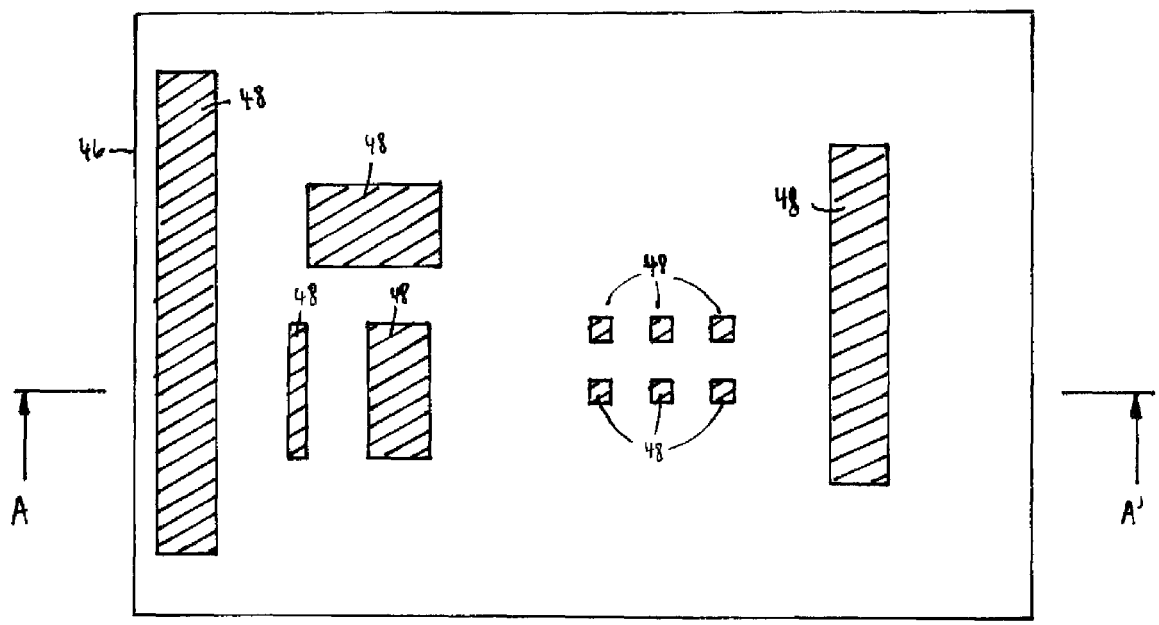
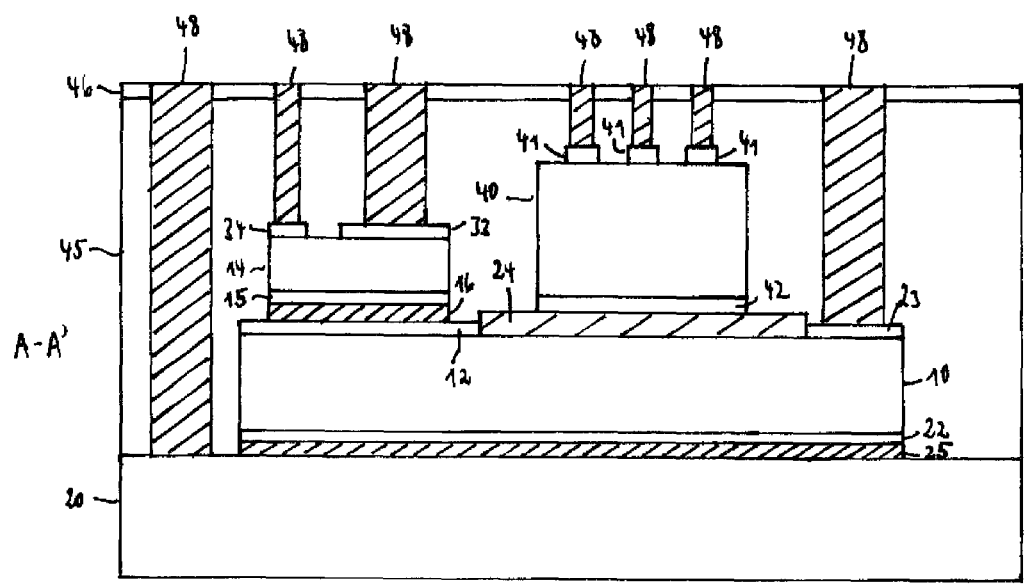
Fig. 2H

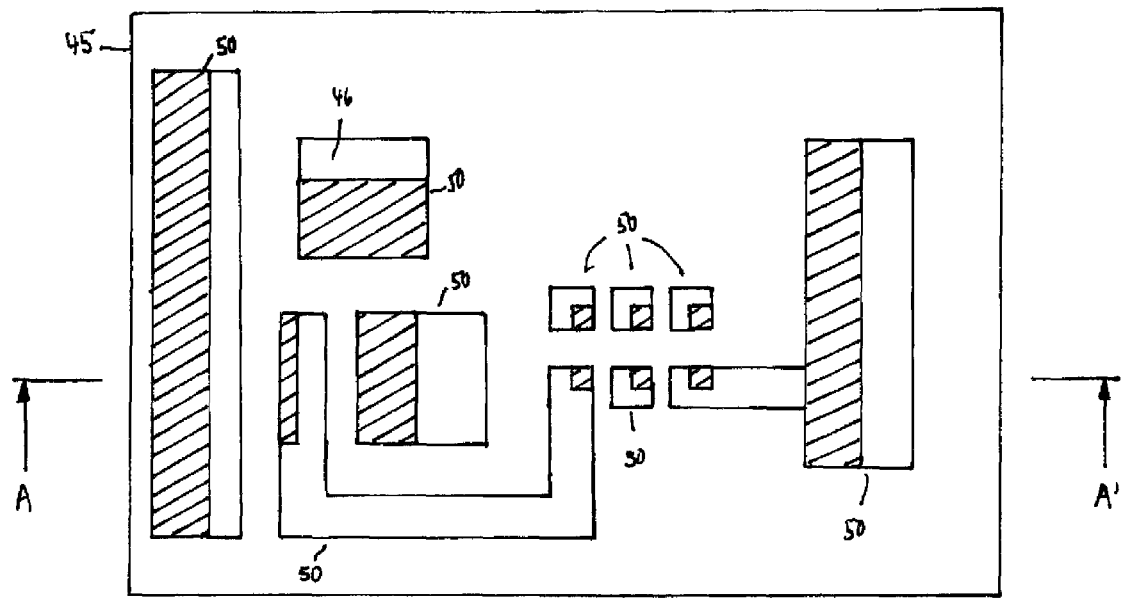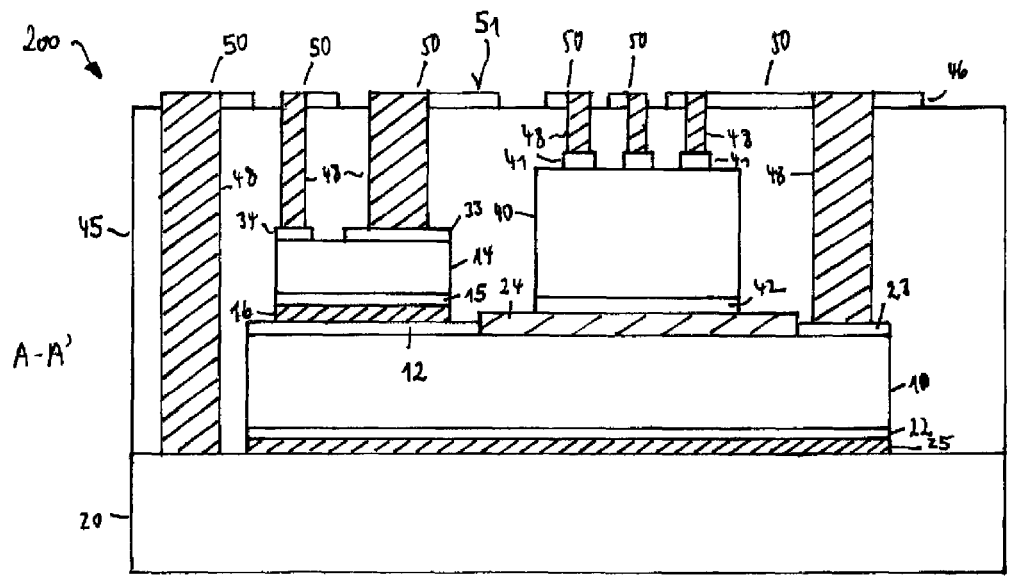
Fig. 2I

DEVICE INCLUDING TWO SEMICONDUCTOR CHIPS AND MANUFACTURING THEREOF

TECHNICAL FIELD

Embodiments of this invention relate to a device including two semiconductor chips. Embodiments of the invention further relate to a method of manufacturing a device including two semiconductor chips.

BACKGROUND

It is useful to stack integrated circuits, sensors, micromechanical apparatuses or other components one over the other for high system integration. The more components are stacked on top of each other within a device, the less area is required on a circuit board to arrange the device.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 2A-2I schematically illustrate a top plan view and a cross-sectional view of one embodiment of a method of manufacturing a device including stacking several semiconductor chips on each other and laminating a dielectric foil on the semiconductor chips;

DETAILED DESCRIPTION OF ILLUSTRATIVE EMBODIMENTS

Figure 1:
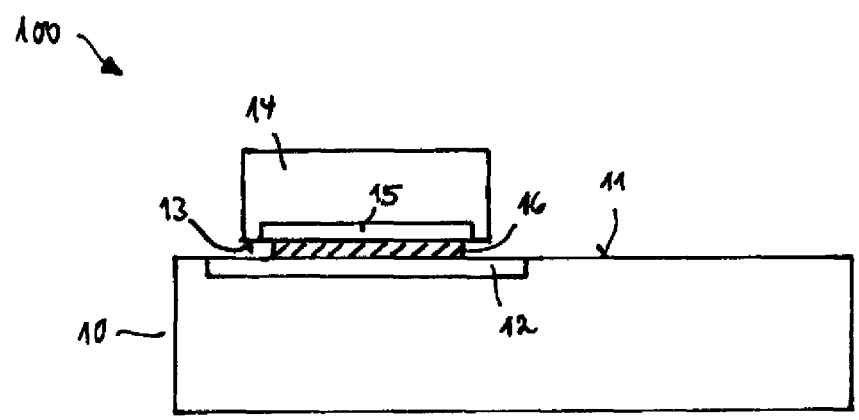
FIG. 1 schematically illustrates a cross-sectional view of one embodiment of a device including two semiconductor chips stacked on each other.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include, for example, integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as so-called MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, magnetic field sensors, electro-magnetic field sensors, microphones etc. The semiconductor chips need not be manufactured from specific semiconductor material, for example, Si, SiC, SiGe, GaAs, and, furthermore, may contain inorganic and/or organic materials that are not semiconductors, such as, for example, insulators, plastics or metals. Moreover, the semiconductor chips may be packaged or unpackaged.

In particular, semiconductor chips having a vertical structure may be involved, that is to say that the semiconductor chips may be fabricated in such a way that electric currents can flow through the semiconductor material in a direction perpendicular to the main surfaces of the semiconductor chips. A semiconductor chip having a vertical structure may have contact pads in particular on its two main faces, that is to say on its top side and bottom side. In other words, a semiconductor chip having a vertical structure has an active top side and an active bottom side. In particular, power semiconductor chips may have a vertical structure. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on one main face, while the drain electrode of the power MOSFET is arranged on the other main face. Furthermore, the devices described below may include integrated circuits to control the power semiconductor chips.

The semiconductor chips may have contact pads (or contact elements or electrodes) which allow electrical contact to be made with the integrated circuits included in the semiconductor chips. The contact pads may include one or more metal layers applied to the semiconductor material of the semiconductor chips. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The devices described below may include two semiconductor chips stacked on top of each other. Exactly one layer of an electrically conductive material may be arranged between the two semiconductor chips. The electrically conductive material may consist of one of solder material, electrically conductive adhesive and metal nano-particles. In one embodiment, the electrically conductive material contains different components, for example, resin and metal particles in the case of an adhesive, but these components are homogeneously distributed over the exactly one layer.

The semiconductor chips or at least parts of the semiconductor chips may be covered with a dielectric material or a lamination material. This material may cover any fraction of any number of surfaces of the components of the device. The dielectric material may be any appropriate laminate (prepreg), duroplastic, thermoplastic or thermosetting material and may contain filler materials. Various techniques may be employed to cover the semiconductor chips with the dielectric material, for example, lamination, compression molding, injection molding, powder molding or liquid molding. Heat and/or pressure may be used to apply the dielectric material.

The dielectric material may serve various functions. It may be used, for example, to electrically insulate components of the device from each other and/or from external components, but the dielectric material may also be used as a platform to mount other components, for example, wiring layers. The dielectric material may be used to produce fan-out type packages. In a fan-out type package at least some of the external contact elements and/or conductor tracks connecting the semiconductor chip to the external contact elements are located laterally outside of the outline of the semiconductor chip or at least intersect the outline of the semiconductor chip. Thus, in fan-out type packages, a peripherally outer part of the package of the semiconductor chip is typically (additionally) used for electrically bonding the package to external applications, such as application boards, etc. This outer part of the package encompassing the semiconductor chips effectively enlarges the contact area of the package in relation to the footprint of the semiconductor chip, thus leading to relaxed constraints in view of package pad size and pitch with regard to later processing, e.g., second level assembly.

The devices described below include external contact elements, which may be of any shape, size and material. The external contact elements are accessible from outside the device and thus allow electrical contact to be made with the semiconductor chips from outside the device. In addition, the external contact elements may be thermally conducting and may serve as heat sinks for dissipating the heat generated by the semiconductor chips. The external contact elements may be composed of any desired electrically conducting material. The external contact elements may include external contact pads. Solder material may be deposited on the external contact pads. The solder material may have the shape of solder balls and may, for example, be composed of SnPb, SnAg, SnAgCu, SnAgCuNi, SnAu, SnCu and/or SnBi.

FIG. 1 schematically illustrates a cross-sectional view of a device 100. The device 100 includes a first semiconductor chip 10 having a first face 11 and a first contact pad 12 arranged on the first face 11. In addition, the device 100 includes a second semiconductor chip 14 having a first face 13 and a first contact pad 15 arranged on the first face 13. The second semiconductor chip 14 is placed over the first semiconductor chip 10 such that the first face 11 of the first semiconductor chip 10 faces the first face 13 of the second semiconductor chip 14. Exactly one layer 16 of an electrically conductive material is arranged between the first semiconductor chip 10 and the second semiconductor chip 14. The layer 16 electrically couples the first contact pad 12 of the first semiconductor chip 10 to the first contact pad 15 of the second semiconductor chip 14.

Figure 2E:
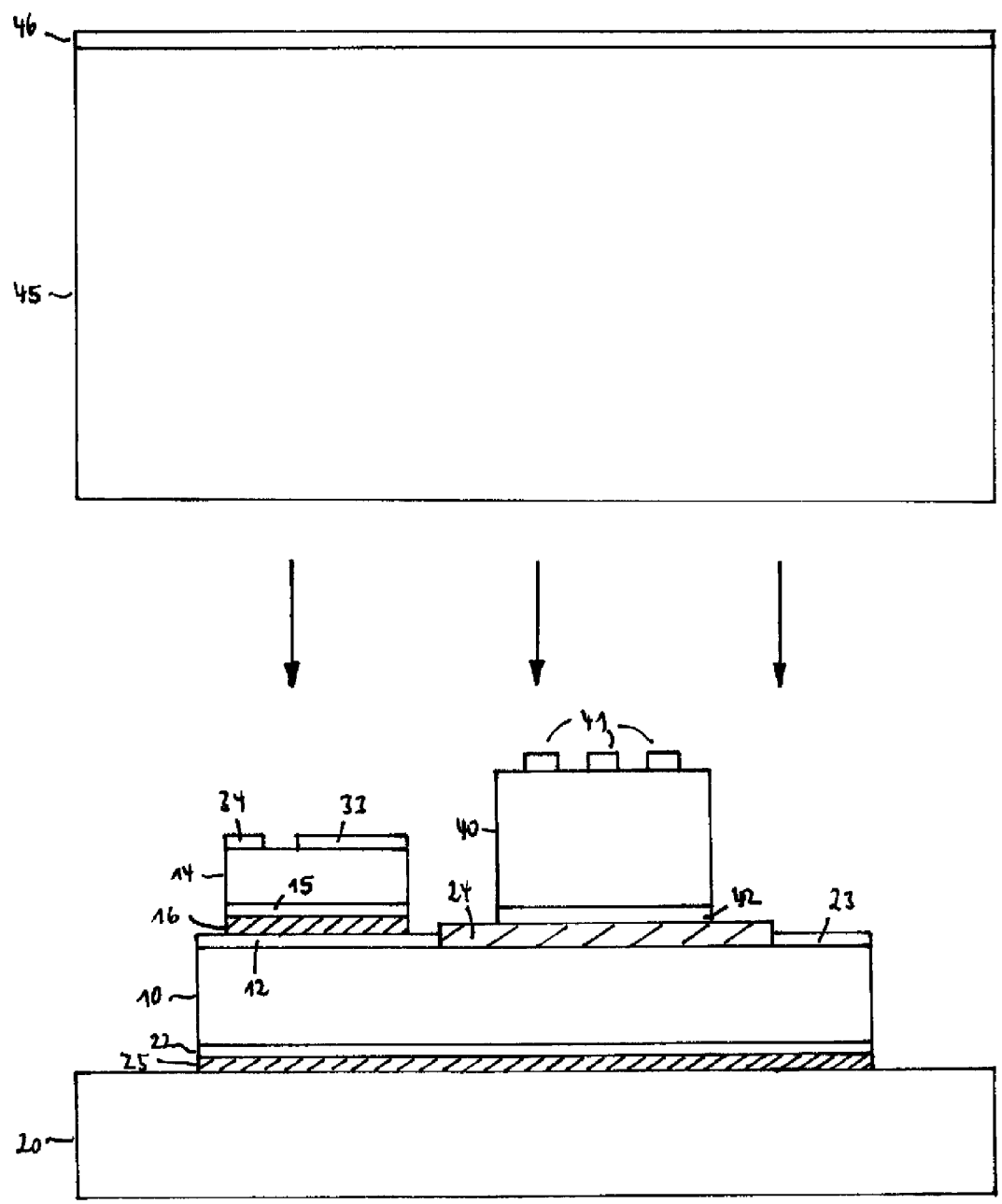

FIGS. 2A-2I schematically illustrate a top plan view and a cross-sectional view of one embodiment of a method of manufacturing a device 200, which is illustrated in FIG. 2I. The device 200 is an implementation of the device 100 illustrated in FIG. 1. The details of the device 200 that are described below can therefore be likewise applied to the device 100. Similar or identical components of the devices 100 and 200 are denoted by the same reference numerals.

FIG. 2A illustrates a carrier 20 in a top plan view (top) and a cross-sectional view (bottom) along the line A-A' depicted in the top plan view. The carrier 20 may be a leadframe and may have any geometric shape. The carrier 20 is not limited to any size, for example, the carrier 20 may have a thickness in the range from 100 nm to 1 mm or may even be thicker. The carrier 20 may be electrically conductive and may be entirely manufactured from a metal, for example copper, or a metal alloy, for example, iron nickel. The carrier 20 may be plated with an electrically conductive material, for example, copper, silver, iron nickel or nickel phosphorus.

FIG. 2B illustrates a power semiconductor chip 10 which is mounted on the carrier 20. Further semiconductor chips may additionally be mounted on the carrier 20 which are not illustrated in FIG. 2B. The power semiconductor chip 10 has a first face 11 and a second face 21 opposite to the first face 11. A first contact pad 12 and a second contact pad 22 are arranged on the first face 11 and the second face 21, respectively. In addition, a third contact pad 23 is arranged on the first face 11. Each of the contact pads 12, 22 and 23 may include one or more metal layers applied to the semiconductor material of the power semiconductor chip 10. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. In one embodiment, the second contact pad 22 covers the entire second face 21 of the power semiconductor chip 10. A portion of the first face 11 of the power semiconductor chip 10 that does not form part of the first and the third contact pad 12, 23 is covered by a passivation layer 24, which may be made of any appropriate dielectric material, for example, polyimide or silicon nitride.

The power semiconductor chip 10 may, for example, be a power diode or a power transistor, such as a power MOSFET, an IGBT, a JFET or a power bipolar transistor. In the case of a power MOSFET, which is exemplarily shown in FIG. 2B, the first and the second contact pad 12 and 22 may be source and drain electrodes (load electrodes), respectively. In this case, the third electrode 23 functions as a gate electrode (control electrode). During operation, voltages of up to 5, 50, 100, 500 or 1000 V or even higher may be applied between the source and drain electrodes 12 and 22. The switching frequency applied to the gate electrode 23 may be in the range from 1 kHz to 100 MHz, but may also be outside this range.

The power semiconductor chip 10 is mounted on the carrier 20 with its second face 21 facing the carrier 20. It may be provided that exactly one layer 25 of an electrically conductive material is arranged between the carrier 20 and the power semiconductor chip 10. The layer 25 has a first face 17 and a second face 18 opposite to the first face 17. At the first face 17, the electrically conductive material of the layer 25 is in direct contact with the carrier 20. At the second face 18, the electrically conductive material of the layer 25 is in direct contact with the contact element 22 of the power semiconductor chip 10. The layer 25 electrically couples the contact pad 22 of the power semiconductor chip 10 to the carrier 20. In addition, the layer 25 firmly attaches the power semiconductor chip 10 to the carrier 20. Prior to the attachment of the power semiconductor chip 10 to the carrier 20, the layer 25 may be deposited on the contact pad 22 or the carrier 20 or both the contact pad 22 and the carrier 20.

In one embodiment, the electrically conductive material of the layer 25 only consists of one or more of a soft solder material, a diffusion solder material, an electrically conductive adhesive and a paste comprising metal nano-particles. In one embodiment, the electrically conductive material of the layer 25 contains different components, for example, resin and metal particles in the case of an adhesive, but these components are homogeneously distributed over the layer 25. In case the layer 25 is made of solder material, the use of Sn, AuSn, AgSn, CuSn, AgIn, AuIn, CuIn, AuSi or Au solders or other appropriate solder materials is possible. In case of diffusion soldering, in particular, AuSn or AgSn may be used. In case of soft soldering, in particular, SnPb, SnCuAg or SnAgSb may be used. After the power semiconductor chip 10 has been placed over the carrier 20, heat is applied to melt the solder material. Reflow soldering, vacuum soldering, soft soldering, diffusion soldering or other soldering techniques may be used. If an electrically conductive adhesive is used to mount the power semiconductor chip 10 on the carrier 20, the adhesive may be based on epoxy resins and be enriched with gold, silver, nickel or copper in order to produce the electrical conductivity. The adhesive may be heated to a certain temperature to harden the adhesive. In one embodiment, a paste containing metal nano-particles and a liquid, in which the metal nano-particles are dispersed, is used to attach the power semiconductor chip 10 to the carrier 20. The metal particles may, for example, be made of silver, gold, copper, tin or nickel. At least a fraction of the metal particles, for example, more than 20% or 30% or 40% or 50% or 60% or 70% or 80% of the metal particles, may have diameters smaller than 100 nm or 50 nm or 10 nm. The metal nano-particles may be heated to a temperature below the melting temperature of the metal they are made of The temperature may be high enough to initiate a sintering process, thereby forming a sintered layer of the metal nano-particles between the contact pad 22 and the carrier 20. In addition, the liquid, in which the metal nano-particles are dispersed, evaporates during the temperature step. In one embodiment, the metal nano-particles are heated to a temperature higher than the melting temperature of the metal they are made of.

The contour (or outline) of the first contact pad 12 defines a first section 26 of the first face 11 of the power semiconductor chip 10. In the top plan view of the power semiconductor chip 10, the first section 26 is indicated by a shaded area.

FIG. 2C illustrates a power semiconductor chip 14 which is mounted on the power semiconductor chip 10. The power semiconductor chip 14 has a first face 13 and a second face 32 opposite to the first face 13. The power semiconductor chip 14 includes a first contact pad 15, which is arranged on the first face 13, and a second and a third contact pad 33, 34, which are arranged on the second face 32. Each of the contact pads 15, 33 and 34 may include one or more metal layers applied to the semiconductor material of the power semiconductor chip 14. In one embodiment, the first contact pad 15 covers the entire first face 13 of the power semiconductor chip 14. The power semiconductor chip 14 may, for example, be a power diode or a power transistor, such as a power MOSFET, an IGBT, a JFET or a power bipolar transistor. In the case of a power MOSFET, which is exemplarily shown in FIG. 2C, the first and second contact pads 15 and 33 may be drain and source electrodes (load electrodes), respectively. In this case, the third contact pad 34 functions as a gate electrode (control electrode). During operation, voltages of up to 5, 50, 100, 500 or 1000 V or even higher may be applied between the drain and source electrodes 15 and 33. The switching frequency applied to the gate electrode 34 may be in the range from 1 kHz to 100 MHz, but may also be outside this range.

The power semiconductor chip 14 is mounted on the power semiconductor chip 10 with its first face 13 facing the contact pad 12 of the power semiconductor chip 10. Exactly one layer 16 of an electrically conductive material is arranged between the power semiconductor chip 10 and the power semiconductor chip 14. The layer 16 has a first face 35 and a second face 36 opposite to the first face 35. At the first face 35, the electrically conductive material of the layer 16 is in direct contact with the contact element 12 of the power semiconductor chip 10. At the second face 36, the electrically conductive material of the layer 16 is in direct contact with the contact element 15 of the power semiconductor chip 14. The layer 16 electrically couples the contact pad 12 of the power semiconductor chip 10 to the contact pad 15 of the power semiconductor chip 14. In addition, the layer 16 firmly attaches the power semiconductor chip 14 to the power semiconductor chip 10. Prior to the attachment of the power semiconductor chip 14 to the power semiconductor chip 10, the layer 16 may be deposited on the contact pad 12 or the contact pad 15 or on both contact pads 12 and 15.

In one embodiment, the electrically conductive material of the layer 16 only consists of one or more of a soft solder material, a diffusion solder material, an electrically conductive adhesive and a paste comprising metal nano-particles. In one embodiment, the electrically conductive material of the layer 16 contains different components, for example, resin and metal particles in the case of an adhesive, but these components are homogeneously distributed over the layer 16. In case the layer 16 is made of solder material, the use of Sn, AuSn, AgSn, CuSn, AgIn, AuIn, CuIn, AuSi or Au solders or other appropriate solder materials is possible. In case of diffusion soldering, in particular, AuSn or AgSn may be used. In case of soft soldering, in particular, SnPb, SnCuAg or SnAgSb may be used. After the power semiconductor chip 14 has been placed over the power semiconductor chip 10, heat is applied to melt the solder material. Reflow soldering, vacuum soldering, soft soldering, diffusion soldering or other soldering techniques may be used. If an electrically conductive adhesive is used to mount the power semiconductor chip 14 on the power semiconductor chip 10, the adhesive may be based on epoxy resins and be enriched with gold, silver, nickel or copper in order to produce the electrical conductivity. The adhesive may be heated to a certain temperature to harden the adhesive. In one embodiment, a paste containing metal nano-particles and a liquid, in which the metal nano-particles are dispersed, is used to attach the power semiconductor chip 14 to the power semiconductor chip 10. The metal particles may, for example, be made of silver, gold, copper, tin or nickel. At least a fraction of the metal particles, for example, more than 20% or 30% or 40% or 50% or 60% or 70% or 80% of the metal particles, may have diameters smaller than 100 nm or 50 nm or 10 nm. The metal nano-particles may be heated to a temperature below the melting temperature of the metal they are made of. The temperature may be high enough to initiate a sintering process, thereby forming a sintered layer of the metal nano-particles between the contact pads 12 and 15. In addition, the liquid, in which the metal nano-particles are dispersed, evaporates during the temperature step. In one embodiment, the metal nano-particles are heated to a temperature higher than the melting temperature of the metal they are made of. In one embodiment, heat is applied to the layer 25 (to adhere the power semiconductor chip 10 to the carrier 20) and the layer 16 (to adhere the power semiconductor chip 14 to the power semiconductor chip 10) at the same time.

In one embodiment, the power semiconductor chip 14 is placed on the first contact pad 12 of the power semiconductor chip 10 such that the power semiconductor chip 14 is arranged fully within the first section 26. Thus, the power semiconductor chip 14 is not located laterally outside of the outline of the first section 26 and does not intersect the outline of the first section 26. In this case the size of the power semiconductor chip 14 is smaller than the size of the power semiconductor chip 10. In a further embodiment, the power semiconductor chip 14 is at least partially placed outside the first section 26.

FIG. 2D illustrates a semiconductor chip 40 mounted on the passivation layer 24 of the power semiconductor chip 10. The semiconductor chip 40 includes a logic integrated circuit and has an active face including contact pads 41 facing away from the power semiconductor chip 10. An adhesive 42 is used to attach the semiconductor chip 40 to the passivation layer 24.

FIG. 2E illustrates a dielectric foil 45 which is placed over the carrier 20 and the semiconductor chips 10, 14 and 40. The dielectric foil 45 is made of a lamination material. The top surface of the dielectric foil 45 is coated with a metal layer 46, for example, a copper layer. The metal layer 46 faces away from the carrier 20.

Figure 2F:
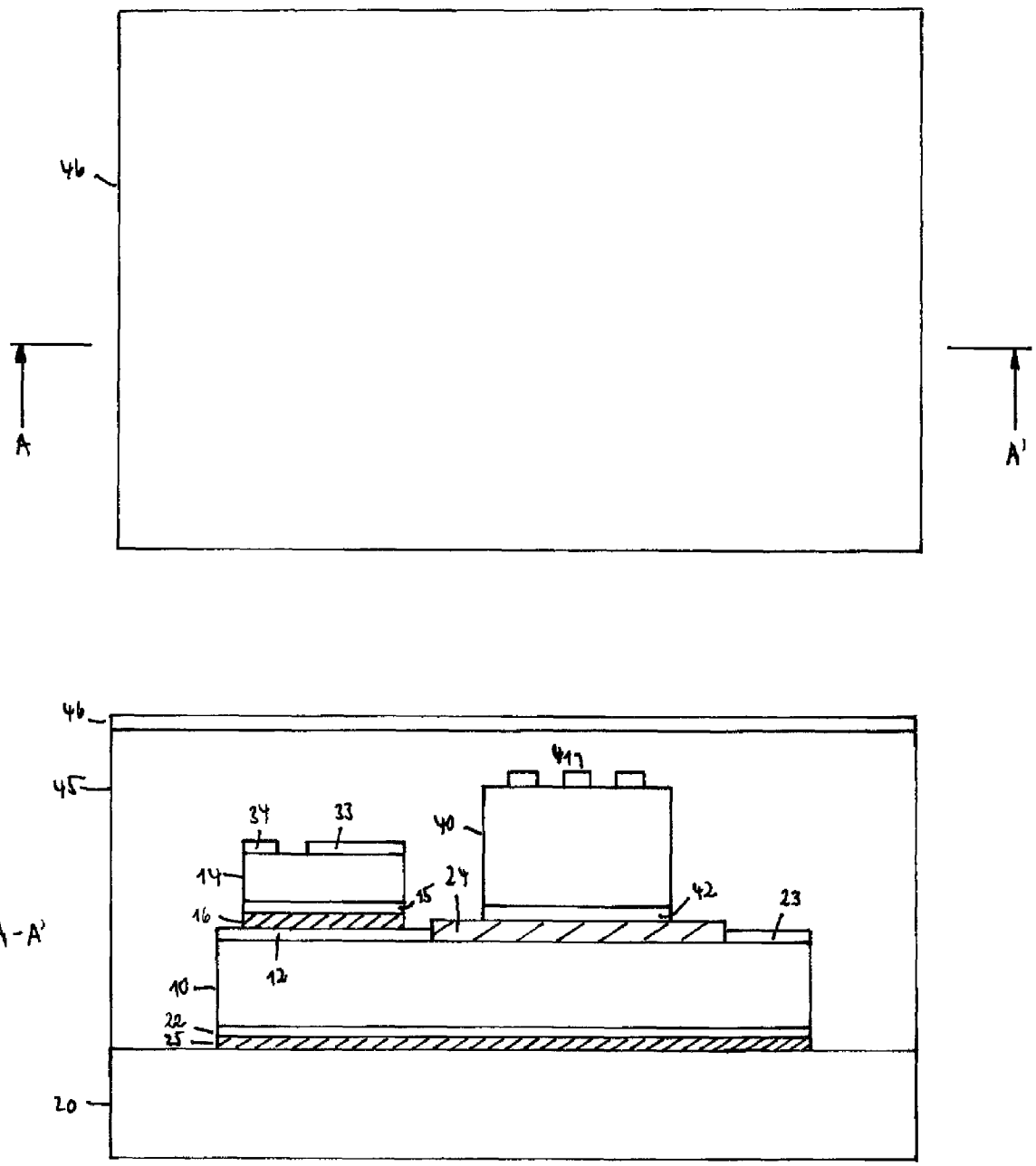

FIG. 2F illustrates that the dielectric foil 45 is laminated over the carrier 20 and the semiconductor chips 10, 14 and 40. The dielectric foil 45 encapsulates the top and side surfaces of the semiconductor chips 10, 14 and 40. The dielectric foil 45 may be made of an electrically insulating polymer material, which may have the shape of a foil or sheet. Heat and/or pressure may be applied for a time suitable to attach the dielectric foil 45 to the underlying structure. The gaps between the components arranged on the carrier 20 are also filled with the dielectric foil 45. The polymer material of the dielectric foil 45 may, for example, be a prepreg that is a combination of a fiber mat, for example, glass or carbon fibers, and a resin, for example, a duroplastic material. Prepreg materials are usually used to manufacture PCBs. Well known prepreg materials that are used in PCB industry and that can be used here as the polymer material are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 10, 14 and 40 and hardened during a heat-treatment. For the lamination of the prepreg the same or similar process steps can be used as in PCB manufacturing. Furthermore, the dielectric foil 45 together with the metal layer 46 may be a RCC (resin coated copper).

FIG. 2G illustrates that the dielectric layer 45 together with the metal layer 46 is structured in order to create a plurality of cutouts or through-holes 47 in the dielectric layer 45 and the metal layer 46. The through-holes 47 expose at least portions of the carrier 20 and the contact pads 12, 23, 33, 34 and 41 so that electrical connections can be made to those exposed regions. The dielectric layer 45 and the metal layer 46 may be structured by etching or by using laser ablation.

FIG. 2H illustrates a metal material 48 that fills the through-holes 47 created in the dielectric layer 45 and the metal layer 46. The metal material 48 may be deposited by chemical deposition and/or electroless and/or galvanic plating processes. The metal material 48 may be any appropriate metal or metal alloy, for example, copper or aluminum. The metal material 48 forms vias in the dielectric layer 45 and electrically couples the carrier 20 and the contact pads 12, 23, 33, 34 and 41 to the metal layer 46.

FIG. 2I illustrates the metal layer 46 after a structuring step in order to produce the footprint of the device 200. For this purpose a dry resist film may be laminated on the top of the metal layer 46 (not illustrated in FIG. 2I), which is photo-structurable. Recesses may be formed in the resist film by exposure to light having a suitable wave-length. For that, a laser beam or light exposure through a mask may be employed. Subsequently, the resist film is developed and the thereby exposed portions of the metal layer 46 are etched. Afterwards the resist film is stripped off, and only the structured metal layer 46 remains on the dielectric layer 45 as illustrated in FIG. 2I.

The metal layer 46 is structured such that contact pads 41 of the semiconductor chip 40 are coupled to the contact pad 23 of the power semiconductor chip 10 and the contact pad 34 of the power semiconductor chip 14. This allows the semiconductor chip 40 to control the power semiconductor chips 10 and 14.

The remaining parts of the metal layer 46 and the top surfaces of the metal material 48 form external contact pads 50, which allow to electrically access the semiconductor chips 10, 14 and 40 from outside of the device 200. In addition, the top surface of the metal layer 46 and the metal material 48 form a mounting surface 51. The mounting surface 51 may serve to mount the device 200 onto another component, for example, a circuit board.

The device 200 as illustrated in FIG. 2I is a fan-out type package. The dielectric foil 45 allows the external contact pads 50 to extend beyond the outline of the semiconductor chip 10. The external contact pads 50 therefore do not need to be arranged within the outline of the semiconductor chip 10 but can be distributed over a larger area. The increased area which is available for arrangement of the external contact pads 50 as a result of the dielectric layer 45 means that the external contact pads 50 cannot only be arranged at a great distance from one another, but that the maximum number of external contact pads 50 which can be arranged there is likewise increased compared to the situation when all the external contact pads 50 are arranged within the outline of the semiconductor chip 10.

Due to the stacking of the semiconductor chips 10, 14 and 40 within the device 200, the device 200 has relatively small dimensions. In addition, the electrical connection paths between the semiconductor chips 10, 14 and 40 are short, which results in fast switching times. The resistance, capacitances and inductances of the device 200 are also reduced. Moreover, the heat generated by the semiconductor chips 10, 14 and 40 during use can be dissipated via the top and the bottom surface of the device 200. The electrical and thermal resistance between the power semiconductor chips 10 and 14 is reduced due to the exactly one layer 16 of an electrically conductive material arranged between the two power semiconductor chips 10 and 14. In addition, the layer 16 reduces mechanical stress that is induced in the power semiconductor chips 10 and 14 during the temperature steps of the manufacturing process.

Figure 3:
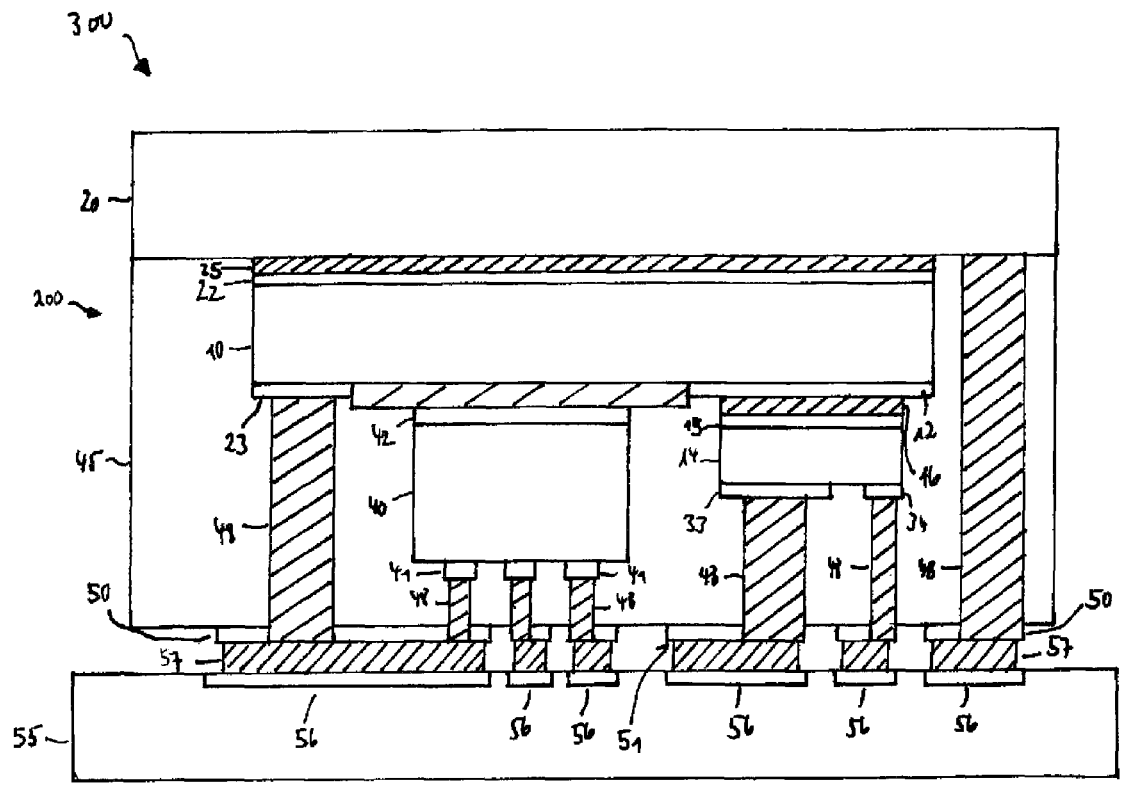
FIG. 3 schematically illustrates a cross-sectional view of one embodiment of a system including a circuit board and a device mounted on the circuit board.

FIG. 3 schematically illustrates a cross-sectional view of a system 300. The system 300 includes the device 200 and a circuit board 55. The device 200 is mounted on the circuit board 55 with its mounting surface 51 facing the circuit board 55. Further devices which are not illustrated in FIG. 3 may be additionally mounted on the circuit board 55. The circuit board 55 may be a PCB (printed circuit board) and may include contact pads 56 on its upper surface to which the external contact pads 50 of the device 200 are attached by using solder deposits 57.

Figure 4:
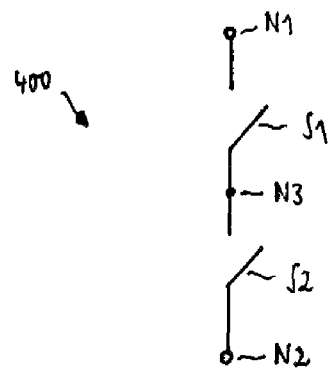
FIG. 4 illustrates a basic circuit of a half-bridge circuit.

FIG. 4 shows a basic circuit 400 of a half-bridge circuit arranged between two nodes N1 and N2. The half-bridge consists of two switches S1 and S2 connected in series. The power semiconductor chips 14 and 10 of the device 200 may be implemented as the switches S1 and S2, respectively. Constant electrical potentials may be applied to the nodes N1 and N2. For example, a high potential, such as 10, 50, 100, 200, 500 or 1000 V or any other potential, may be applied to the node N1 and a low electrical potential, for example 0V, may be applied to the node N2. Thus, the power semiconductor chip 14 is the high-side switch S1, whereas the power semiconductor 10 is the low-side switch S2. The switches S1 and S2 may be switched at frequencies in the range from 1 kHz to 100 MHz, but the switching frequencies may also be outside this range. This means that a varying electrical potential is applied to a node N3 arranged between the switches S1 and S2 during operation of the half-bridge. The potential of the node N3 varies in the range between the low and the high electrical potential.

The half-bridge may, for example, be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage. Frequencies of several MHz or higher may be applied to DC-DC converters. Furthermore, currents of up to 50 A or even higher may flow through the DC-DC converters.

It is obvious to a person skilled in the art that the device 200 illustrated in FIG. 2I and the manufacturing thereof as described above are only intended to be an exemplary embodiment, and many variations are possible. For example, further semiconductor chips or passives of different types may be included in the same device 200. The semiconductor chips and passives may differ in function, size, manufacturing technology etc.

Figure 5A:
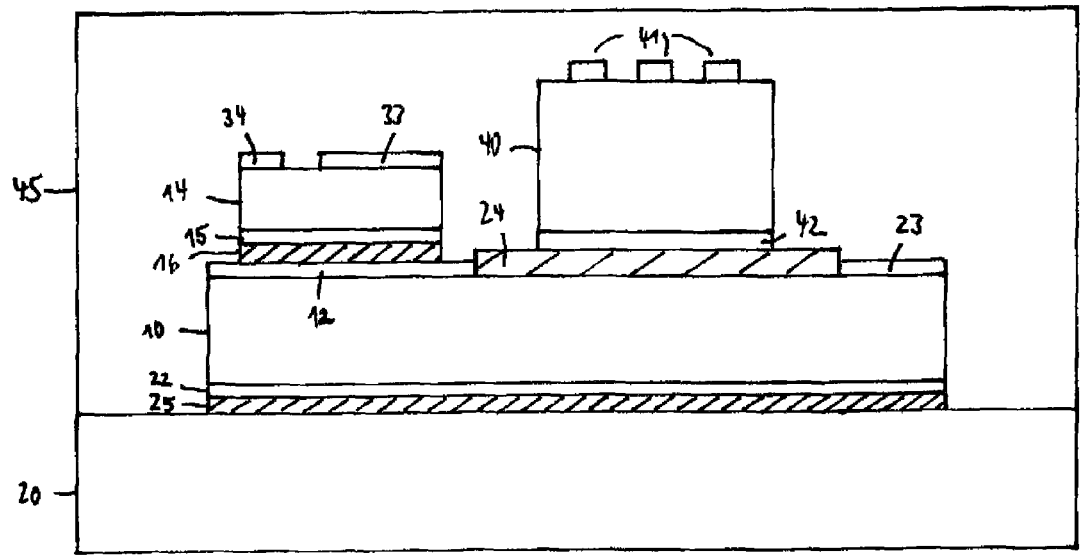
FIGS. 5A-5D schematically illustrate a cross-sectional view of one embodiment of a method of manufacturing a device including stacking several semiconductor chips on each other and producing external contact elements by galvanic deposition.
Figure 5B:
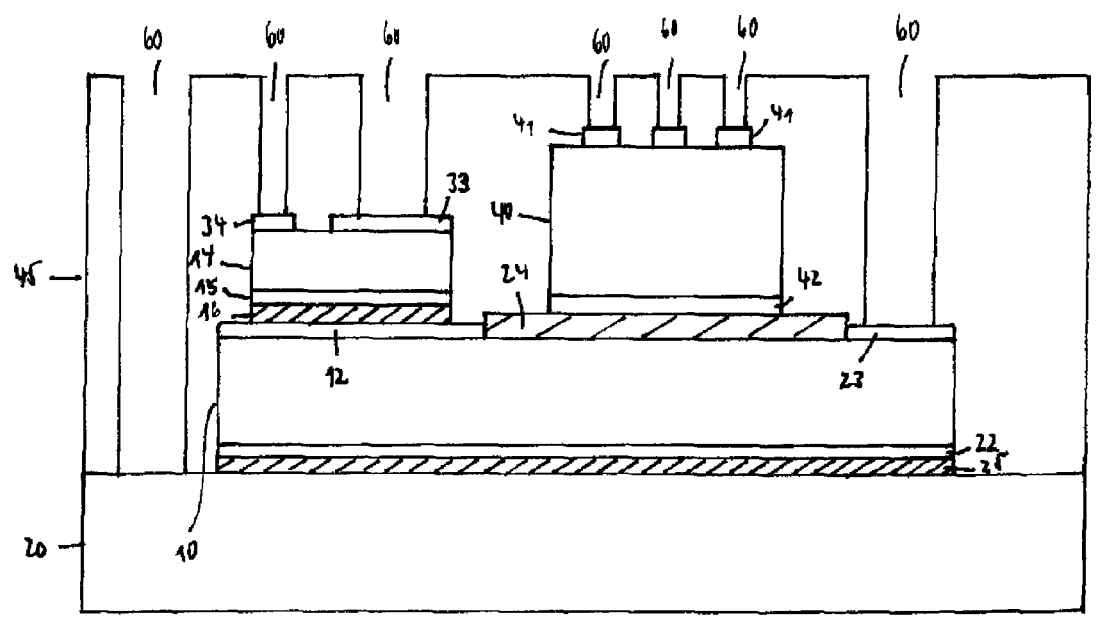
Figure 5C:
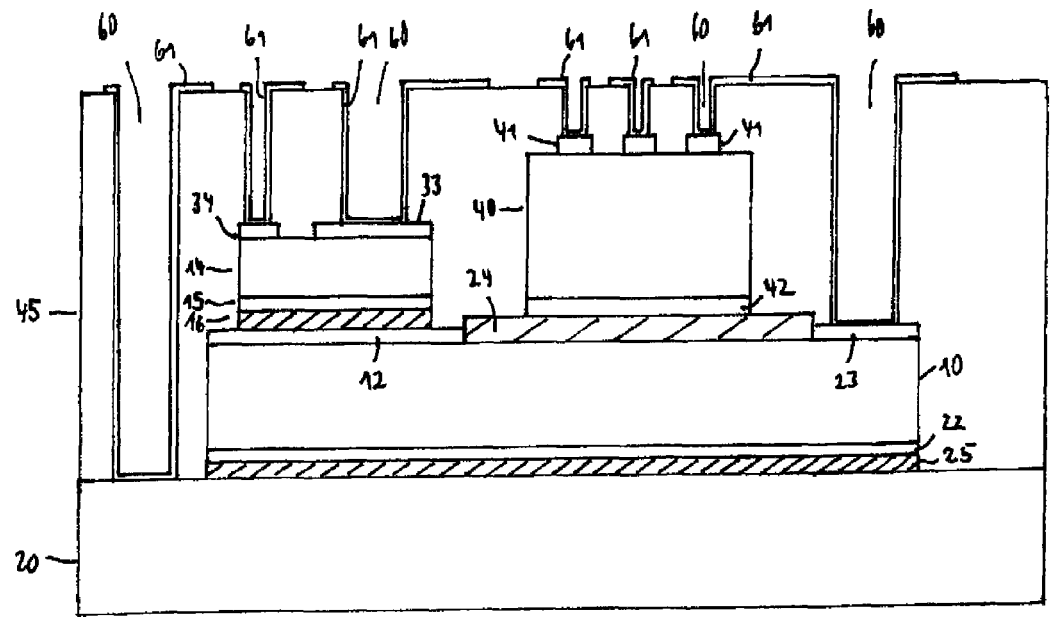
Figure 5D:
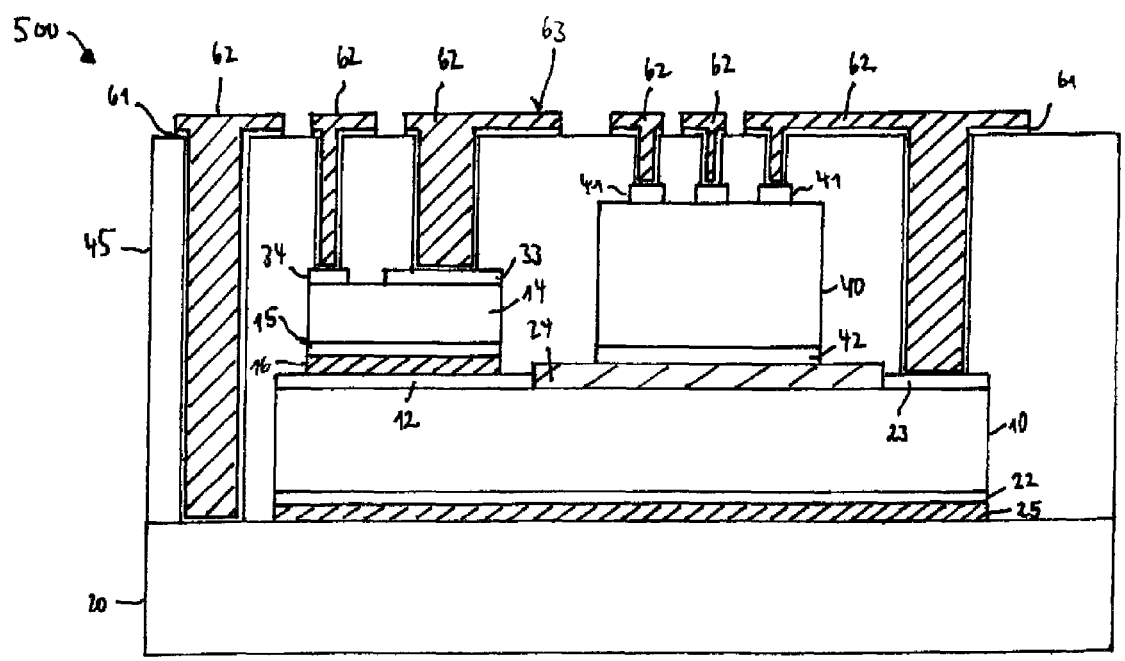

A variation of the manufacturing process illustrated in FIGS. 2A-2I is schematically illustrated in FIGS. 5A-5D. A device 500 that is obtained from the manufacturing process as detailed in the following is illustrated in FIG. 5D.

FIG. 5A illustrates the device obtained from the process steps illustrated in FIG. 2A-2F where the dielectric foil 45 is laminated over the carrier 20 and the semiconductor chips 10, 14 and 40. In the embodiment illustrated in FIG. 5A, however, the top surface of the dielectric foil 45 is exposed and is not coated with a metal layer.

FIG. 5B illustrates that the dielectric layer 45 is structured in order to create a plurality of through-holes 60 in the dielectric layer 45. The through-holes 60 expose at least portions of the carrier 20 and the contact pads 12, 23, 33, 34 and 41 so that electrical connections can be made to those exposed regions. The dielectric layer 45 may be structured by etching or by using laser ablation.

FIG. 5C illustrates a seed layer 61 that is chemically or electroless deposited onto the surfaces of the through-holes 60 and the top surface of the dielectric layer 45. Materials such as suitable polymers or palladium or titanium may be used for the seed layer 61 which usually has a thickness of less than 1 μm. The thickness of the seed layer 61 may be increased by depositing a further layer of an electrically conductive material onto the seed layer 61. For example, a layer of copper may be electroless deposited onto the seed layer 61 (not shown in FIG. 5C). This copper layer may have a thickness of less than 1 μm. The seed layer 61 is subsequently structured as illustrated in FIG. 5C.

FIG. 5D illustrates a layer 62 of copper or any other suitable metal or metal alloy, which is galvanically deposited on the structured seed layer 61. The layer 62 may have a thickness of more than 5 μm. The layer 62 may only cover the walls of the through-holes 60, however the through-holes 60 may also be completely filled with the metal material.

Due to the structuring of the seed layer 61, the portions of the metal layer 62 deposited on the top surface of the dielectric layer 45 form external contact pads, which allow to electrically access the semiconductor chips 10, 14 and 40 from outside of the device 500. The top surface of the metal layer 62 forms a mounting surface 63. The mounting surface 63 may serve to mount the device 500 on another component, for example, a circuit board.

Figure 6A:
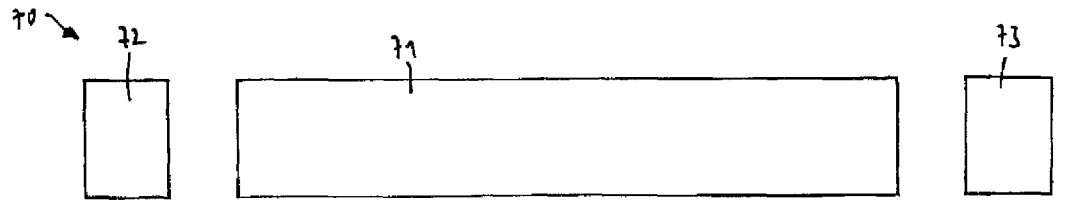
FIGS. 6A-6D schematically illustrate a cross-sectional view of one embodiment of a method of manufacturing a device including stacking several semiconductor chips on a structured leadframe.
Figure 6B:
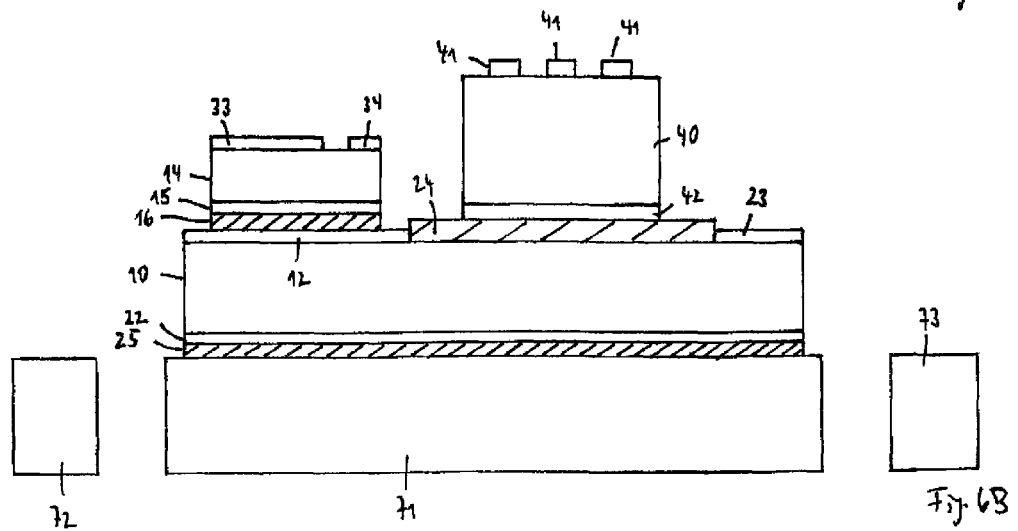
Figure 6C:
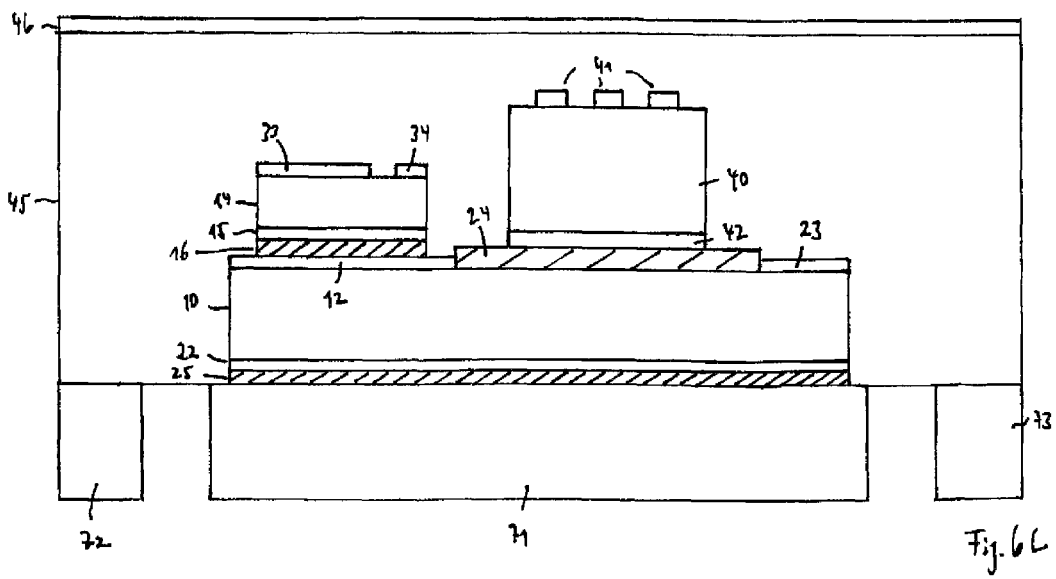
Figure 6D:
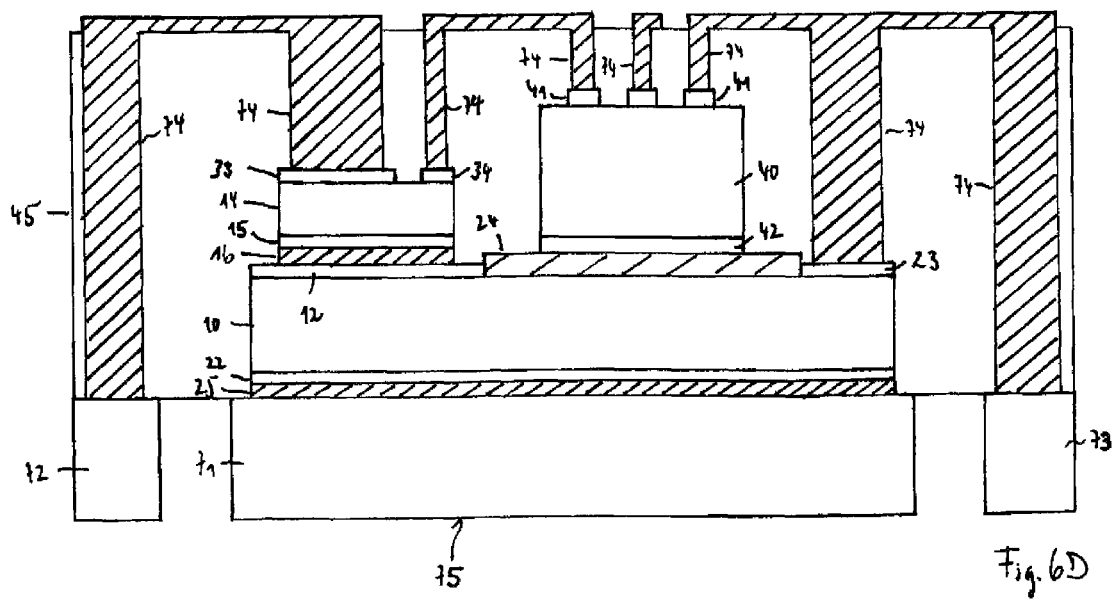

A further variation of the manufacturing process illustrated in FIGS. 2A-2I is schematically illustrated in FIGS. 6A-6D. A device 600 that is obtained from the manufacturing process as detailed in the following is illustrated in FIG. 6D.

FIG. 6A illustrates a leadframe 70 including a die pad 71 and external contact elements 72 and 73.

The leadframe 70 may have any geometric shape and the external contact elements 72 and 73 may be arranged in any way. The leadframe 70 is not limited to any size, for example, the leadframe 70 may have a thickness in the range from 100 μm to 1 mm or may be even thicker. The leadframe 70 may be manufactured from a metal, for example, copper, or a metal alloy, for example, iron nickel. The leadframe 70 may be plated with an electrically conductive material, for example, copper, silver, iron nickel or nickel phosphorus. The leadframe 70 may have been stamped or milled in order to generate the outer shape of the leadframe 70 as illustrated in FIG. 6A. The leadframe 70 may include further die pads and/or external contact elements which are not shown in FIG. 6A.

FIG. 6B illustrates that semiconductor chips 10, 14 and 40 are mounted on the die pad 71 as described above in connection with FIGS. 2B-2D.

FIG. 6C illustrates a dielectric foil 45 with a metal layer 46 which is laminated over the die pad 71, the external contact elements 72 and 73 and the semiconductor chips 10, 14 and 40 as described above in connection with FIGS. 2E-2F.

FIG. 6D illustrates vias extending through the dielectric layer 45 in order to electrically couple the contact pads 12, 23, 33, 34 and 41 to the external contact pads of the leadframe 70. The vias may, for example, be manufactured as described above in connection with FIGS. 2G-2I. The bottom surface of the leadframe 70 is a mounting surface 75.

Figure 7:
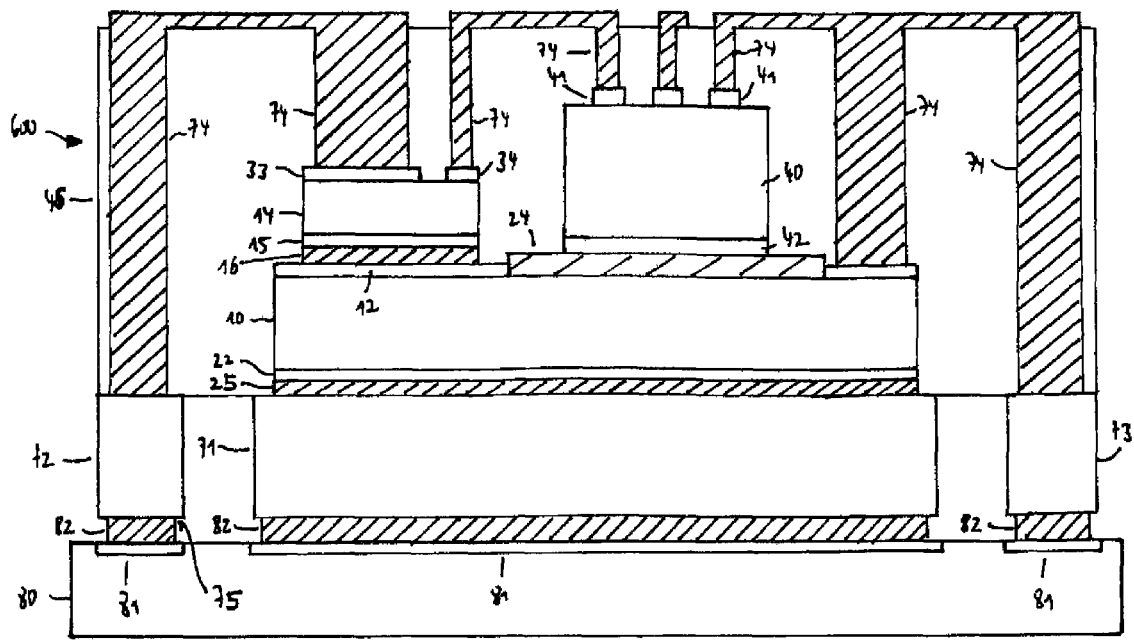
FIG. 7 schematically illustrates a cross-sectional view of one embodiment of a system including a circuit board and a device mounted on the circuit board.

FIG. 7 schematically illustrates a cross-sectional view of a system 700. The system 700 includes the device 600 and a circuit board 80. The device 600 is mounted on the circuit board 80 with its mounting surface 75 facing the circuit board 80. Further devices which are not illustrated in FIG. 7 may be additionally mounted on the circuit board 80. The circuit board 80 may be a PCB (printed circuit board) and may include contact pads 81 on its upper surface to which the die pad 71 and the external contact pads 72 and 73 of the device 600 are attached by using solder deposits 82.

Figure 8A:
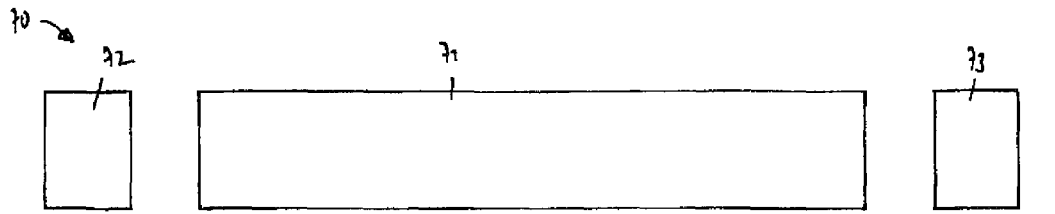
FIGS. 8A-8D schematically illustrate a cross-sectional view of one embodiment of a method of manufacturing a device including stacking several semiconductor chips on a leadframe and coupling the semiconductor chips to the leadframe by using bond wires.
Figure 8B:
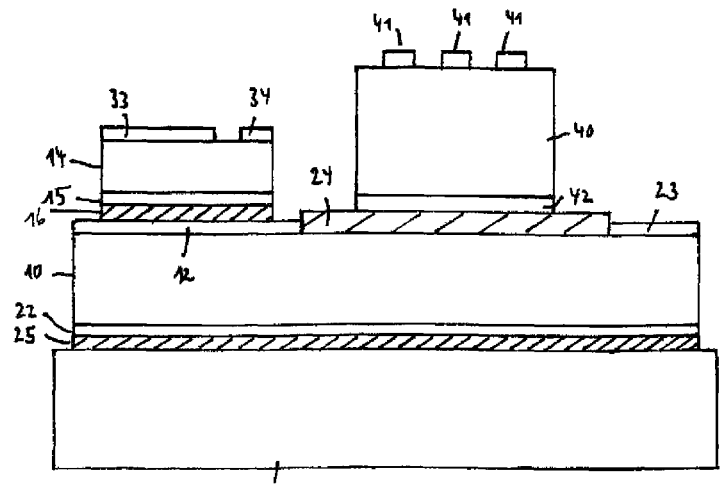
Figure 8C:
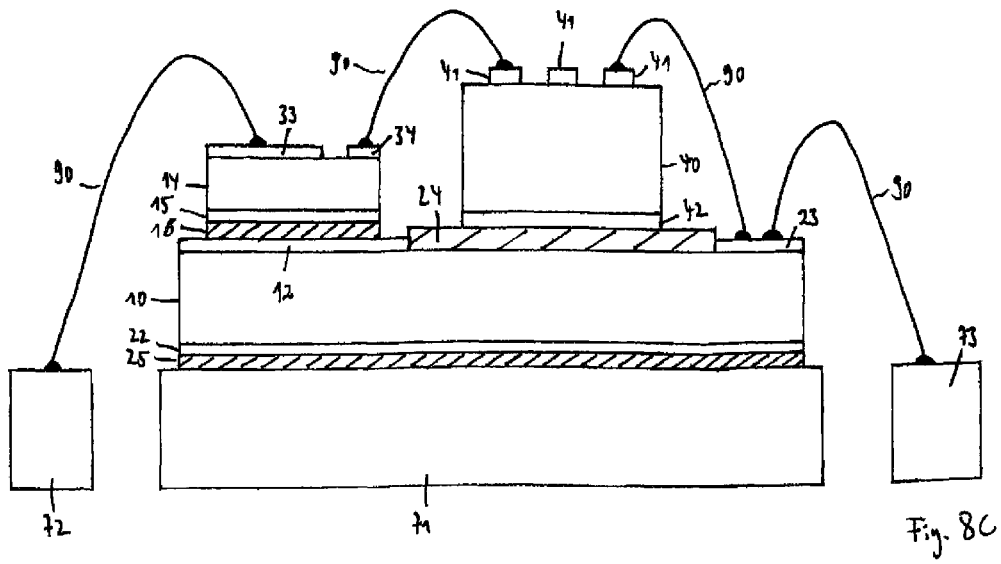
Figure 8D:
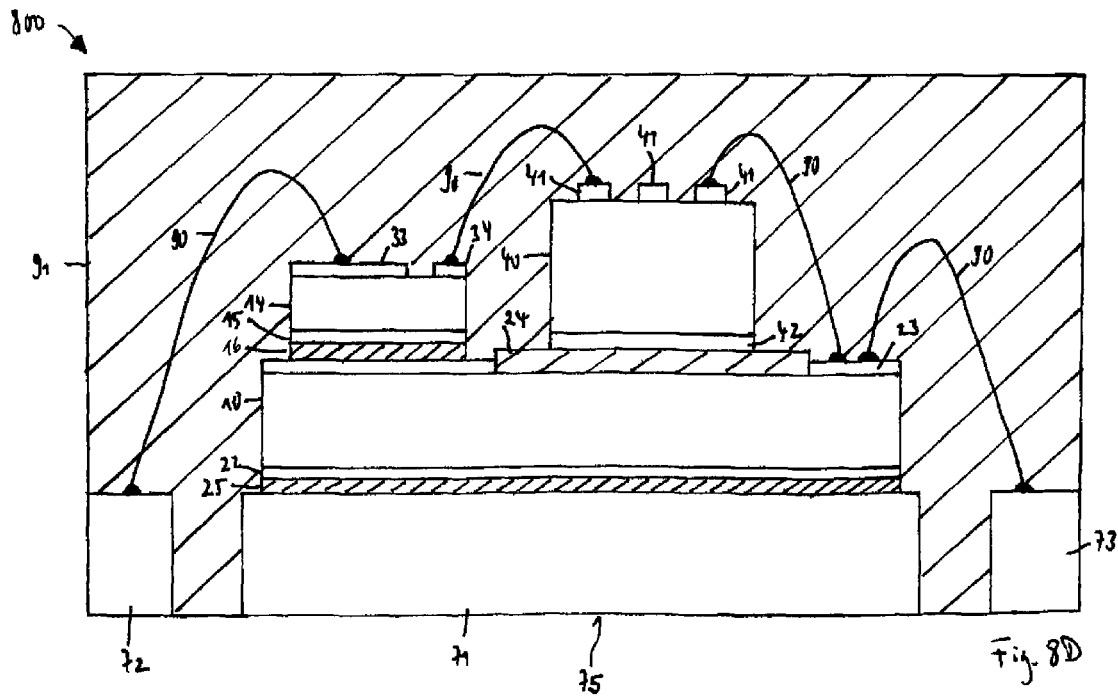

A further variation of the manufacturing process illustrated in FIGS. 2A-2I is schematically illustrated in FIGS. 8A-8D. A device 800 that is obtained from the manufacturing process as detailed in the following is illustrated in FIG. 8D.

FIG. 8A illustrates a leadframe 70 including a die pad 71 and external contact elements 72 and 73 as described above in connection with FIG. 6A.

FIG. 8B illustrates that semiconductor chips 10, 14 and 40 are mounted on the die pad 71 as described above in connection with FIGS. 2B-2D.

FIG. 8C illustrates bond wires 90, which electrically couple the contact pads 12, 23, 33, 34 and 41 of the semiconductor chips 10, 14 and 40 to the external contact elements of the leadframe 70. In one embodiment, metal clips are used instead of bond wires 90 to electrically couple the contact pads 12, 23, 33, 34 and 41 to the leadframe 70.

FIG. 8D illustrates a mold compound 91, which encapsulates the leadframe 70 and the semiconductor chips 10, 14 and 40. The mold compound 91 may be a thermoplastic or thermosetting material and may contain filler materials. Various techniques may be employed to apply the mold compound 91, for example, compression molding, injection molding, powder molding or liquid molding. The mounting surface of the device 800 as illustrated in FIG. 8D is the bottom surface 75 of die pad 71 and the external contact elements 72 and 73, which is exposed from the mold compound 91.

Figure 9:
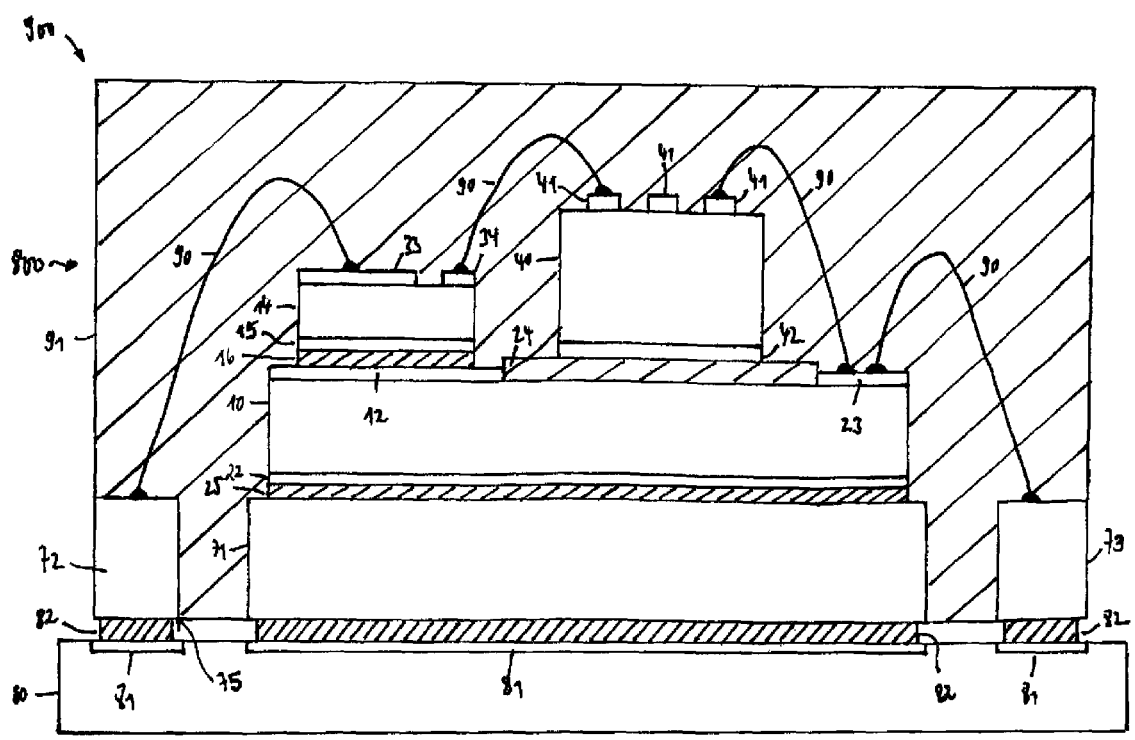
FIG. 9 schematically illustrates a cross-sectional view of one embodiment of a system including a circuit board and a device mounted on the circuit board.

FIG. 9 schematically illustrates a cross-sectional view of a system 900. The system 900 includes the device 800 and the circuit board 80. The device 800 is mounted on the circuit board 80 with its mounting surface 75 facing the circuit board 80. Further devices which are not illustrated in FIG. 9 may be additionally mounted on the circuit board 80. The die pad 71 and the external contact elements 72 and 73 of the device 800 are attached to the contact pads 81 of the circuit board 80.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
a first semiconductor chip comprising a first contact pad on a first face;
a second semiconductor chip comprising a first contact pad on a first face, wherein the second semiconductor chip is placed over the first semiconductor chip, the first face of the first semiconductor chip faces the first face of the second semiconductor chip, and the first contact pad on the first face of the first semiconductor chip is directly opposite the first contact pad on the first face of the second semiconductor chip; and
exactly one layer of an electrically conductive material arranged between the first semiconductor chip and the second semiconductor chip, wherein
the exactly one layer of an electrically conductive material electrically couples the first contact pad of the first semiconductor chip to the first contact pad of the second semiconductor chip,
a contour of the first contact pad of the first semiconductor chip defines a first section of the first face of the first semiconductor chip, and
the first section of the first semiconductor chip and the exactly one layer of an electrically conductive material each have a smaller area than then an area of the first face of the first semiconductor chip.

2. The device of claim 1, wherein the exactly one layer of an electrically conductive material comprises a first face and a second face opposite to the first face, with the first face of the exactly one layer of the electrically conductive material being in direct contact with the first contact pad of the first semiconductor chip and the second face of the exactly one layer of an electrically conductive material being in direct contact with the first contact pad of the second semiconductor chip.

3. The device of claim 1, wherein the second semiconductor chip is placed within the first section.

4. The device of claim 1, wherein the first semiconductor chip comprises a second contact pad on a second face opposite to the first face.

5. The device of claim 4, further comprising an electrically conductive carrier, wherein the first semiconductor chip is placed on the carrier with the second face facing the carrier.

6. The device of claim 5, wherein a surface of the carrier forms a mounting surface of the device.

7. The device of claim 1, wherein the second semiconductor chip comprises a second contact pad on a second face opposite to the first face.

8. The device of claim 1, wherein the first and the second semiconductor chip are each power semiconductor chips.

9. The device of claim 1, further comprising a lamination material encapsulating the first and the second semiconductor chip.

10. The device of claim 9, further comprising a metal layer placed on the lamination material.

11. The device of claim 10, further comprising vias extending through the lamination material and electrically coupling the first and the second semiconductor chip to the metal layer.

12. The device of claim 11, wherein a surface of the metal layer forms a mounting surface of the device.

13. The device of claim 1, further comprising a third semiconductor chip placed over the first semiconductor chip.

14. The device of claim 13, wherein the third semiconductor chip is configured to control the first and the second semiconductor chip.

15. The device of claim 1, wherein the electrically conductive material comprises a material selected form the group consisting of a soft solder material, a diffusion solder material, an electrically conductive adhesive and a material made of metal nano-particles.

16. A method of forming a device, the method comprising:
providing a first semiconductor chip comprising a first contact pad on a first face;
providing a second semiconductor chip comprising a first contact pad on a first face; and
forming exactly one layer of an electrically conductive material between the first semiconductor chip and the second semiconductor chip, wherein
the second semiconductor chip is placed over the first semiconductor chip and the first face of the first semiconductor chip faces the first face of the second semiconductor chip,
the first contact pad on the first face of the first semiconductor chip is directly opposite the first contact pad on the first face of the second semiconductor chip,
the exactly one layer of the electrically conductive material electrically couples the first contact pad of the first semiconductor chip to the first contact pad of the second semiconductor chip,
a contour of the first contact pad of the first semiconductor chip defines a first section of the first face of the first semiconductor chip,
the first section of the first semiconductor chip and the exactly one layer of an electrically conductive material each have a smaller area than then an area of the first face of the first semiconductor chip, and
the second semiconductor chip is placed within the first section.

17. The method of claim 16, wherein forming the exactly one layer of the electrically conductive material comprises:
depositing the exactly one layer of the electrically conductive material on the first semiconductor chip such that the first contact pad of the first semiconductor chip is in direct contact with the electrically conductive material; and
placing the second semiconductor chip over the first semiconductor chip such that the first contact pad of the second semiconductor chip is in direct contact with the electrically conductive material.

18. The method of claim 17, wherein the electrically conductive material comprises a material selected from the group consisting of a soft solder material, a diffusion solder material, an electrically conductive adhesive and a paste comprising metal nano-particles.

19. The method of claim 17, further comprising laminating a dielectric layer on the first and the second semiconductor chip.

20. The method of claim 19, further comprising removing portions of the dielectric layer until portions of the first and the second semiconductor chip are exposed.

21. The method of claim 20, further comprising depositing a metal material on the exposed portions of the first and the second semiconductor chip.

22. The method of claim 17, wherein the first semiconductor chip and the second semiconductor chip are each power semiconductor chips.

* * * * *

UNITED STATES PATENT AND TRADEMARK OFFICE
CERTIFICATE OF CORRECTION

| | | |
|---|---|---|
| PATENT NO. | : 8,866,302 B2 | Page 1 of 1 |
| APPLICATION NO. | : 13/013022 | |
| DATED | : October 21, 2014 | |
| INVENTOR(S) | : Henrik Ewe | |

It is certified that error appears in the above-identified patent and that said Letters Patent is hereby corrected as shown below:

In the Claims

In Col. 13, line 7, claim 15, delete "selected form" and insert --selected from--.

Signed and Sealed this
Twelfth Day of May, 2015

Michelle K. Lee
*Director of the United States Patent and Trademark Office*